United States Patent [19]

Yamane et al.

[11] Patent Number: 5,036,019
[45] Date of Patent: Jul. 30, 1991

[54] METHOD OF PRODUCING A COMPLEMENTARY-TYPE SEMICONDUCTOR DEVICE

[75] Inventors: Hiroyuki Yamane, Anjo; Yasushi Higuchi, Kariya, both of Japan

[73] Assignee: Nippondenso Co., Ltd., Kariya, Japan

[21] Appl. No.: 537,688

[22] Filed: Jun. 13, 1990

[30] Foreign Application Priority Data

Jun. 16, 1989 [JP] Japan ................... 1-155511

[51] Int. Cl.[5] .......................................... H01L 21/266
[52] U.S. Cl. .......................................... 437/57; 437/34;
437/40; 437/44; 437/913
[58] Field of Search ............. 437/34, 40, 41, 44, 437/913

[56] References Cited

U.S. PATENT DOCUMENTS

| 4,062,699 | 12/1977 | Armstrong | 437/41 |
| 4,382,826 | 5/1983 | Pfleiderer et al. | 437/913 |
| 4,577,391 | 3/1986 | Hsia et al. | |
| 4,597,824 | 7/1986 | Shinada et al. | |
| 4,599,118 | 7/1986 | Han et al. | 437/41 |
| 4,599,789 | 7/1986 | Gasner | |
| 4,697,333 | 10/1987 | Nakahara | 437/20 |
| 4,753,898 | 6/1988 | Parrillo et al. | 437/44 |
| 4,908,327 | 3/1990 | Chapman | 437/56 |
| 4,956,311 | 9/1990 | Liou et al. | 437/34 |

FOREIGN PATENT DOCUMENTS

| 0322665 | 7/1989 | European Pat. Off. | 437/44 |
| 52-33473 | 8/1977 | Japan. | |
| 0282870 | 11/1989 | Japan | 437/34 |

OTHER PUBLICATIONS

Takeda, E. et al., IEEE Trans. on Elec. Dev. ED-29, No. 4, 4/82, pp. 611-618.
Tsong, P. J. et al., IEEE Trans. on Elec. Dev. ED-29, No. 4, 4/82, pp. 590-596.

*Primary Examiner*—Brian E. Hearn
*Assistant Examiner*—Gordon V. Hugo
*Attorney, Agent, or Firm*—Cushman, Darby & Cushman

[57] ABSTRACT

A method of producing a MIS transistor such as a MOS transistor has a P type and an N type channel transistors. P type and N type well regions are provided with the N type and the P type channel transistors, respectively. Both the P type and the N type well regions are covered with an insulating film on which gate electrodes are formed in a predetermined pattern by means of a photo-resist. This photo-resist is used as a channelling block layer when an N type impurity is implanted into the P type well region near the gate electrode so as to form an N type diffusion layer. As a result, the photo-resist prevents the N type impurity from channelling into the gate electrode so that a leak current does not occur within the P type well region of the N type channel transistor.

12 Claims, 7 Drawing Sheets

METHOD OF PRODUCING A COMPLEMENTARY-TYPE SEMICONDUCTOR DEVICE

BACKGROUND OF THE INVENTION

The present invention relates to a method of producing a complementary-type semiconductor device and more particularly to MIS(metal insulator semiconductor) transistors such as CMOS(complementary metal oxide semiconductor) transistors having P-type and an N-type channels.

With regard to reduction in size of CMOS-LSI devices, there have been two major problems which are the so-called hot carrier effect which occurs in N-type transistors and the short-channel effect which occurs in P-type transistors. In the prior art, an LDD(Lightly Doped Drain) structure has been proposed and used in CMOS transistors for the purpose of reducing the hot carrier effect. However, such LDD structures have the following problems.

First, according to a process for producing the LDD structure, an N-type diffusion layer has to be formed at only an N-type transistor of a complementary-type MIS transistor and should not be formed at a P-type transistor thereof. Therefore, for the purpose of covering the P-type transistor with a photo-resist, a further process of photo-lithography is required and causes high production cost.

Further, according to a process for producing the LDD structure, spacers have to be formed on the side walls of gate electrodes so as to form different impurity concentration layers within the LDD structure. Such a process also causes high production cost and low productivity.

In view of the above-described problems with regard to the LDD structures, the inventors of the present invention proposed a new type of CMOS structure which was described in a Japanese patent publication laid-open No. 62-217666 published on Sept. 25, 1987 and a counterpart U.S. patent application Ser. No. 26,998 filed on Mar. 17, 1987. However, in the process of producing devices using this CMOS structure, the inventors of the present invention came to notice the following problems.

As shown in FIG. 11, phosphorus ions (P) are implanted through a gate insulating film 102 and a gate electrode 103 of poly-crystalline silicon served as a mask so that an N-type diffusion layer 101 having a low impurity concentration is formed within a silicon substrate 100. In case that a crystal axis of a part 103a of the polycrystalline silicon is nearly the same as the direction of the ion implant, the phosphorus reaches below the gate electrode 103 and an unnecessary N-type diffusion area 104 is partially formed in the silicon substrate 100. This is a so-called channeling phenomenon which causes an occurrence of a leak current and therefore a lower productivity. The probability of the occurrence of such an area 104 is in the range between one in several thousand and one in a million transistors, which is an extremely severe problem in the production of VLSI(Very Large Scale Integration) devices.

SUMMARY OF THE INVENTION

The object of the present invention is to provide a method of producing a complementary-type semiconductor such as CMIS transistors which effectively prevents the channeling phenomenon therein.

According to the present invention, a complementary-type semiconductor device such as MIS transistor is produced by forming a P type and an N type well regions in a semiconductor substrate. An insulating film is then formed covering the surface of the P type and the N type well regions, forming a gate electrode layer on the insulating film, forming a channelling block layer such as a photo-resist on the gate electrode layer in a predetermined pattern, etching the gate electrode layer except where the photo-resist is formed so as to form a first and a second gate electrodes over the P type and the N type well regions, implanting a first N type impurity such as a phosphorus ion into areas of the P type and N type well regions which are respectively located around the first and the second gate electrodes so as to form N type diffusion layers in the areas, by using the channelling block layer for preventing the first N type impurity from channelling into the first gate electrode, implanting a second N type impurity into the N type diffusion layers formed in the P type well region so as to form an N+ type diffusion layer therein, the impurity concentration of the N+ type diffusion layer being higher than that of the N type diffusion layers, and implanting a P type impurity into the N type diffusion layer formed in the N type well region so as to form a P+ type diffusion layer therein, the impurity concentration of the P+ type diffusion layer being higher than that of the N type diffusion layers.

By using such producing method, the following merits can be obtained.

First of all, as the channelling block layer is formed as a mask, the channelling phenomenon of the first N type impurity does not occur within the gate electrode. This means that an unnecessary N-type diffusion layer is not formed below the gate electrode. As a result, an unnecessary leak current does not occur within the P type well region, and an unstable current is prevented within the N type well region.

With regard to the productivity of this method, as the photo-resist, which is necessary for forming the gate electrode in the former step, is also used as a channelling block layer in the later step for forming the N-type diffusion layer, additional processing steps needed only for preventing the channelling phenomenon of phosphorus ion can be eleminated. As a result, a high quality MIS transistor can be produced without unnecessary production cost and time.

BRIEF DESCRIPTION OF THE DRAWINGS

FIG. 1 through FIG. 7 are cross-sectional views showing a first method of producing a MIS transistor having a P type channel MIS transistor (a) and an N type channel MIS transistor (b) as an embodiment according to the present invention, in which FIG. 1 is a cross-sectional view showing a step that photo-resist is formed on a gate electrode layer, FIG. 2 is a cross-sectional view showing a step that some part of the gate electrode layer is removed so as to form a gate electrode, FIG. 3 is a cross-sectional view showing a step that phosphor is implanted with the N− type well region and the P− type well region so as to form a N type diffusion layer, FIG. 4 is a cross-sectional view showing a step that an oxide film is formed on a gate electrode, FIG. 5 is a cross-sectional view showing a step that an N+ type diffusion layers are formed within a N type diffusion layer, FIG. 6 is a cross-sectional view showing a step that P+ type diffusion layers are formed within the N type diffusion layer, FIG. 7 is a cross-sectional view of a completed MOS transistor;

DETAILED DESCRIPTION OF THE PREFERRED EMBODIMENTS

A preferred embodiment according to the present invention will be explained in detail below with regard to a MIS transistor having a P type channel MIS transistor (a) (hereinafter referred to as "P-MIS") and an N-type channel MIS transistor (b) (hereinafter referred to as "N-MIS") as shown in FIGS. 1 through 7.

Figure 1:
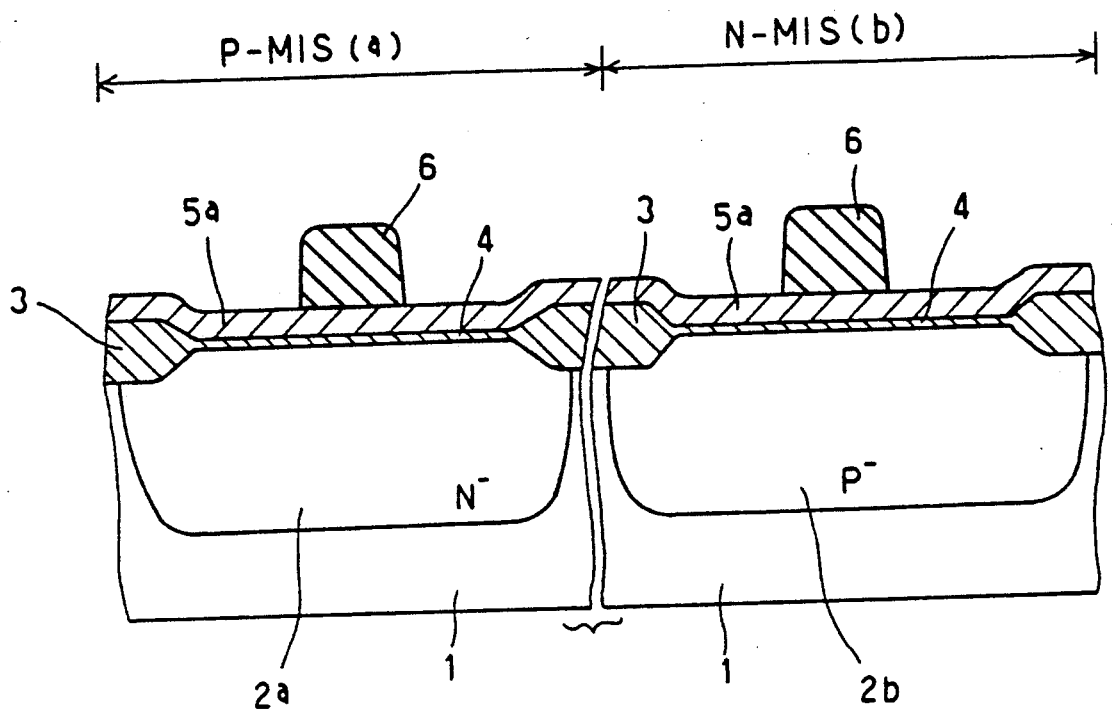

As shown in FIG. 1, P-MIS (a) is formed in a semiconductor substrate 1 of silicon (Si) or the like with an $N^-$-type well region 2a diffused deep with N type impurities such as phosphorus. The impurity concentration of the N type well region is approximately $1 \times 10^{16}$ atoms/cm$^3$. Adjacent to the P-MIS(a), an N-MIS(b) is formed with $P^-$ type well region 2b diffused deep with P impurities such as boron. The impurity concentration of P-type well region is also approximately $1 \times 10^{16}$ atoms/cm$^3$.

The main surfaces of the substrate 1 of the P-MIS and the N-MIS are covered with gate insulating film 4 made of a silicon oxidized film, silicon nitrized film or the combination thereof. The surface of the substrate 1 isolating each MIS transistor is covered with a field insulating film 3 made of silicon oxidized film or the like. An elementisolating region may be formed alternatively by etching the surface of the semiconductor substrate 1 to form a slot, followed by embedding an silicon oxidized film, polycrystal silicon or the like therein. The field insulating film 3 also includes such an element-isolating region.

Thereafter, for the purpose of reducing the threshold voltage of the P-MIS, boron ions (B) are implanted within a surface of the $N^-$ type well region so as to form a P type layer therein. If it is desirable to increase the threshold voltage of N-MIS, boron ions (B) may be implanted within a surface of the $P^-$ type well region so as to form a P type layer therein.

Thereafter, a gate electrode layer 5a made of polycrystalline silicon or an other electrically conductive film such as a high-melting-point metal, is formed on the gate insulating film 4 and the field insulating film 3. Then, a photo-resist 6 is provided on the gate electrode layer 5a in a predetermined pattern by means of photolithography.

Figure 2:
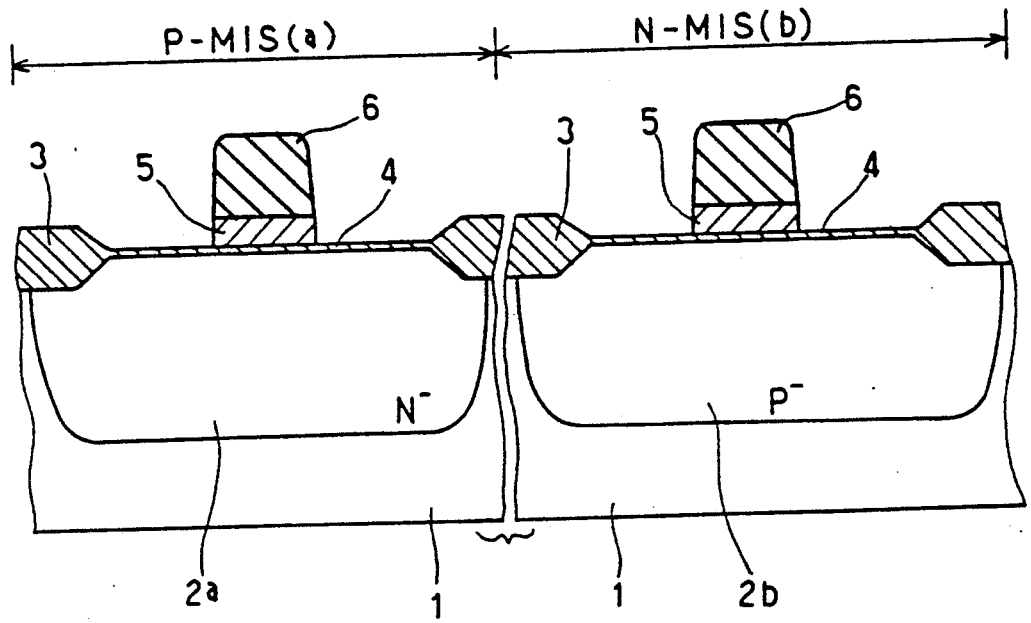

In the next process shown in FIG. 2, the gate electrode layer 5a is etched with photo-resist 6 serving as a mask so that the gate electrode 5 is formed on the gate insulating film 4 in the above-described predetermined pattern. The photo-resist 6 is not removed until an N type diffusion layer is formed in the $N^-$ type well region 2a and the $P^-$ type well region 2b in the next process.

Figure 3:
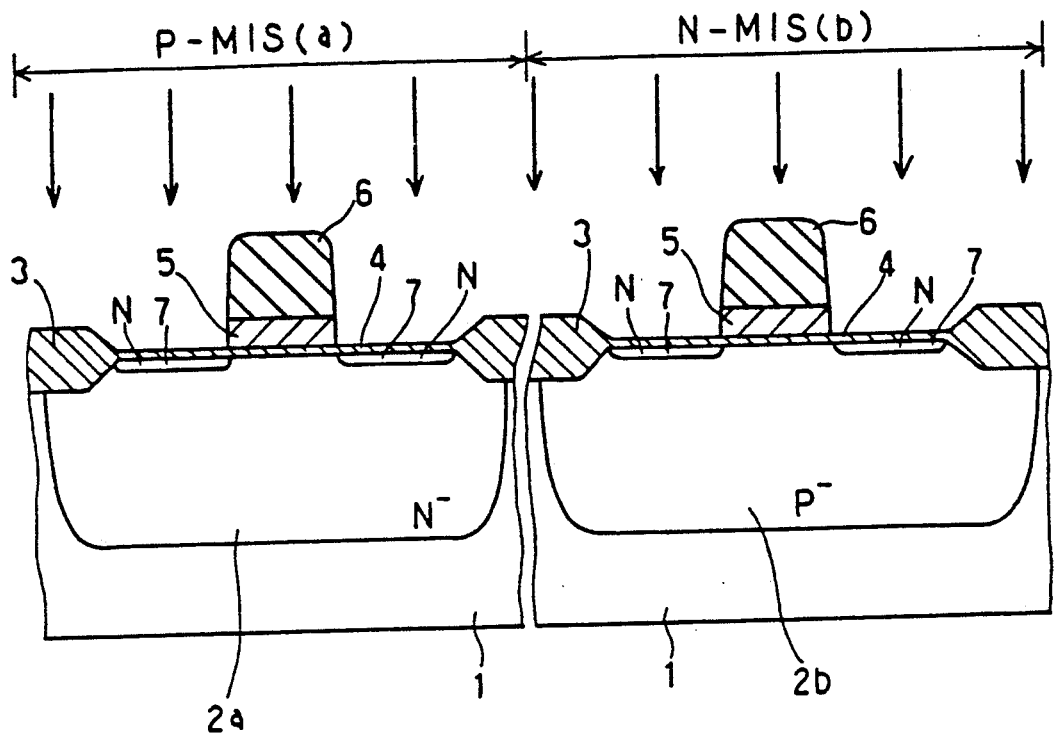

Namely, in the next process shown in FIG. 3, phosphorus ions are implanted into the upper portion of the $N^-$ type well region 2a and the $P^-$ type well region 2b. In this phosphorus ion implantation, the photo-resist 6 prevents the phosphorus ions from reaching the gate electrode 5 and therefore prevents the so-called channelling phenomenon in the gate electrode 5 completely. Accordingly, a further time-consuming treatment for preventing such channelling phenomenon is unnecessary because the photo-resist 6, which was previously provided for forming the gate electrode 5, can be effectively used as a channelling block layer for such phosphorus ion implantation.

Figure 4:
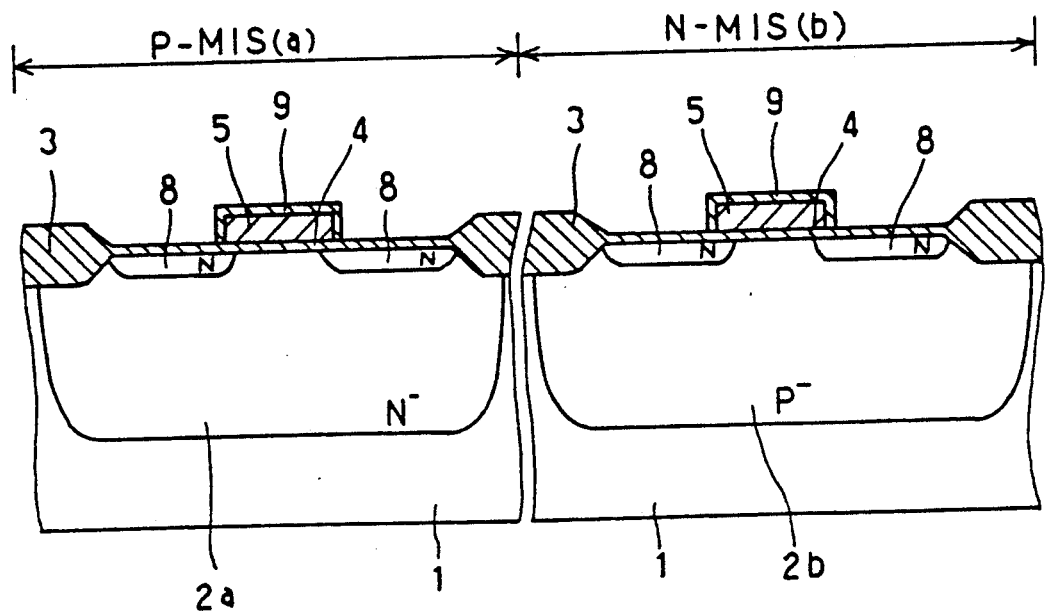

In the process shown in FIG. 4, it is important that the impurity concentration of diffusion layer 8 is in the range of 3 to 30 times higher than the impurity concentration of the $N^-$ type well region 2a and the $P^-$-type well region 2b. According to this embodiment, the impurity concentration of diffusion layer 8 is in the range of approximately $0.3 \times 10^{17} - 3.0 \times 10^{17}$ atoms/cm$^3$. As far as an angle of the phosphorus ion implant is concerned, the phosphorus ions are implanted in a vertical direction as illustrated in FIG. 3 for the purpose of preventing phosphorus ion from being shadowed by the side wall of the photo-resist 6. It is noted that conventional ion implantation is done at an angle of 7 degrees from the vertical direction.

In the next process shown in FIG. 4, the photoresist 6 is removed by a mixture of sulfuric acid ($H_2SO_4$) and hydrogen peroxide ($H_2O_2$) Thereafter, the oxide film 9 is formed on the entire exposed surface of gate electrode 5 by oxidization and diffusion treatment. At the same time, the depth of the diffusion layer 8 is adjusted to a desired value by means of a temperature control.

Figure 5:
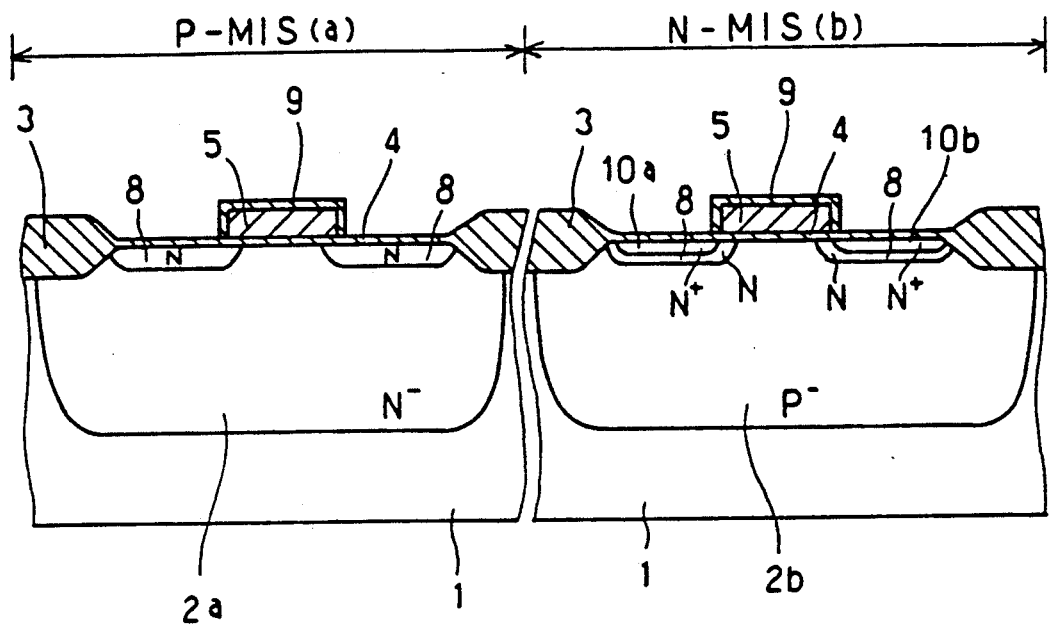

In the next process shown in FIG. 5, an N-type impurity such as phosphorus ion or arsenic ion is implanted into the N-type diffusion layer 8 of the N-MIS(b) through the gate electrode 5 and the field insulating film 3 serving as masks so as to form a first $N^+$-type diffusion layer 10a to be electrically connected to a source electrode and a second $N^+$-type diffusion 10b to be electrically connected to a drain electrode.

Figure 6:
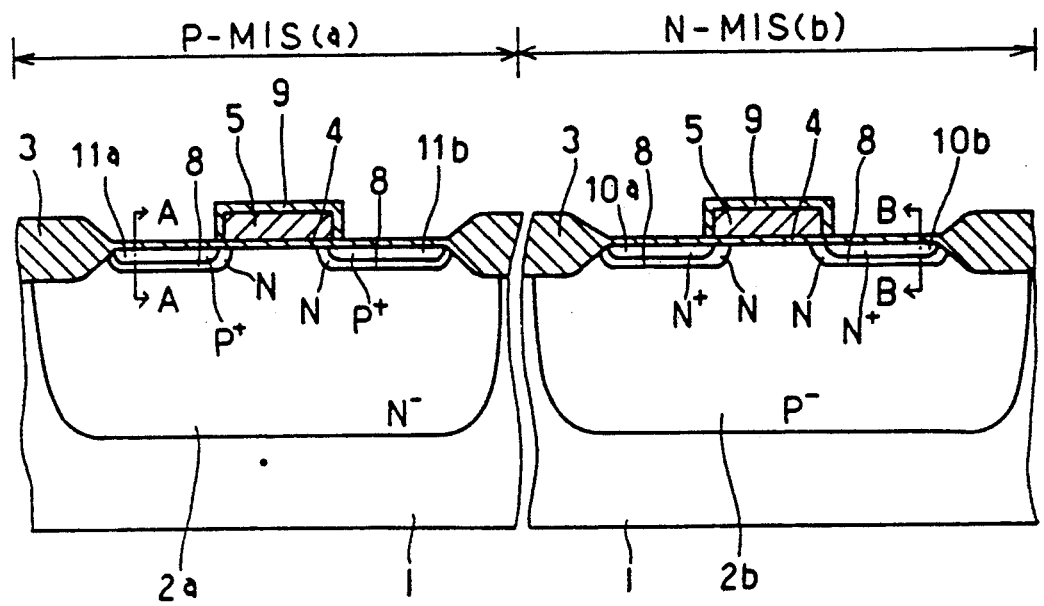

Subsequently, as shown in FIG. 6, a P-type impurity such as boron ions are implanted into the N-type diffusion layer 8 of P-MIS(a) so as to form a first $P^+$-type diffusion layer 11a to be electrically connected to a source electrode and a second $P^+$-type diffusion layer 11b to be connected to a drain electrode.

In the above process, the $N^+$-type diffusion layers 10a and 10b and the $P^+$-type diffusion layers 11a and 11b are formed with higher impurity concentrations, more shallow depths, and narrower widths than those of the N-type diffusion layer 8 as indicated in FIG. 5 and FIG. 6. Contrary to the above-mentioned process order, the $P^+$-type diffusion layers 11a and 11b can be formed earlier than the $N^+$-type diffusion layers 10a and 10b.

Figure 7:
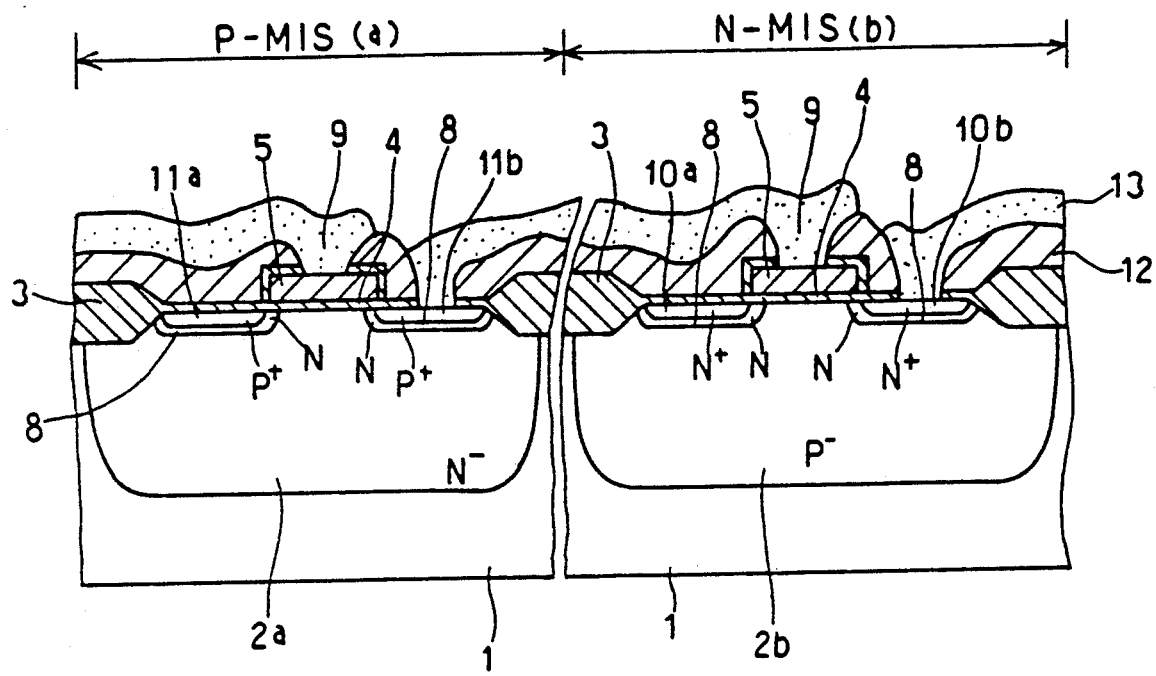

In the final process shown in FIG. 7, after forming a silicon oxide 12 in a predetermined pattern by CVD method and subsequently forming openings at the oxide film 9 and the gate insulating film 4, aluminum electrodes 13 are formed in a predetermined pattern so as to electrically connect the gate electrode 5, $N^+$-type diffusion layers 10a and 10b, and $P^+$-type diffusion layers 11a and 11b therewith.

Hereinafter, the characteristics of the MIS transistor produced by the above-described method will be explained in detail.

First of all, in the process shown in FIG. 3, the photo-resist 6 effectively serves as a channelling block layer for preventing the phosphorus ion from being implanted into the gate electrode 5. Therefore, the channelling phenomenon of phosphorus ion does not occur within the gate electrode 5. This means that an undesirable N-type diffusion layer is not formed below the gate electrode 5. As a result, an undesirable leak current does not occur within the P$^-$-type well region of the N-MIS, and an unstable current is prevented within the P-MIS(a).

With regard to the productivity of the abovedescribed method, as the photo-resist 6, which is necessary for forming the gate electrode 5 in the former step, is also used as a channelling block layer in the later step for forming the N-type diffusion layer 7. Accordingly additional processes needed only for preventing the channelling phenomenon of phosphorus ions can be avoided according to this embodiment. As a result, a high quality MIS transistor can be produced without increasing production cost and time.

Figure 8:
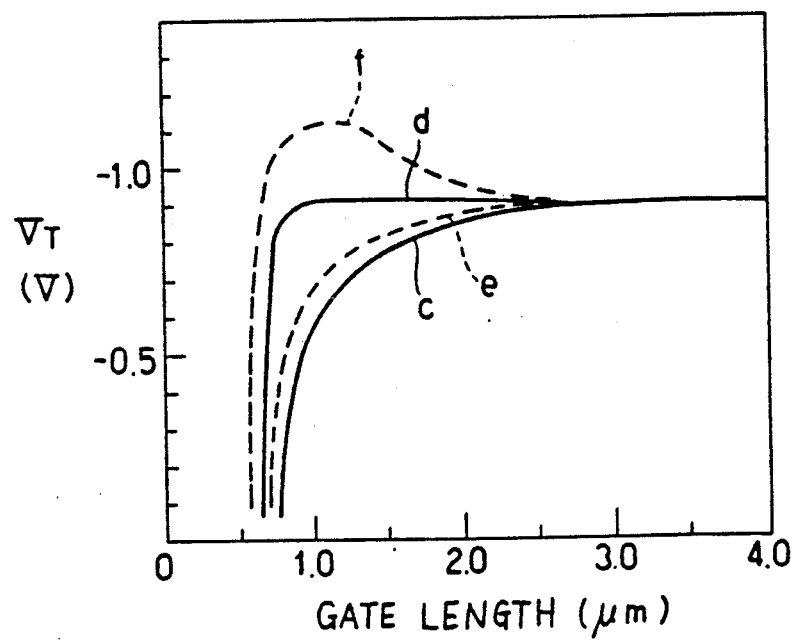
FIG. 8 is a diagram showing the relationship between the gate length and the threshold voltage $V_T$.

In addition to the above-mentioned characteristics of the MIS transistors (a) and (b), since the impurity concentration of the N-type diffusion layer 8 is controlled to a value in the range of three to thirty times higher than that of N$^-$-type well region 2a and P$^-$-type well region, the characteristic of each MIS transistors (a) and (b) can be improved as described below with reference to FIGS. 8, 9 and 10 which are fully explained in the above-cited U.S. application Ser. No. 26,998.

In the P-MIS(a), the N-type diffusion layer 8 causes a high impurity concentration of the channel region AA near the edge of the P$^+$-type diffusion layer 11a. This acts to increase the absolute value $|V_T|$ of the threshold voltage $V_T$ of the MIS transistor (a). This function works to shorten the gate length of the device. With the decrease in the gate length due to the short channel effect, on the other hand, the absolute value $|V_T|$ decreases. Both are balanced to keep the absolute value $|V_T|$ substantially constant regardless of the gate length, thus reducing the short channel effect. This manner will be explained with reference to FIG. 8 showing the relationship between the gate length and the threshold voltage $V_T$. In FIG. 8, the solid line c represents the characteristic in the absence of the N-type diffusion layer 8, and the solid line d represents the characteristic of the present embodiment. According to the present embodiment, the threshold voltage $V_T$ is substantially constant at a gate length of about 0.8 μm or more, indicating that the embodiment is effectively applicable to a MIS transistor with short gate, that is, a MIS transistor smaller in size. The effect of the present embodiment is obtained to some extent as long as the impurity concentration $C_N$ of the N-type diffusion layer 8 is higher than the impurity concentration $C_{N^-}$ of the N$^-$-type well region 2a. The effect of the embodiment becomes more conspicuous to the extent that the impurity concentration $C_N$ is 3 to 30 times higher than the concentration $C_{N^-}$. If the former is 15 to 20 times higher than the latter, a superior characteristic is obtained. The solid line d in FIG. 8 represents the characteristic associated with the last-mentioned case. The dotted lines e and f indicate the characteristics associated with the case where the impurity concentration $C_N$ is less than three times higher and more than 30 times higher than the impurity concentration $C_{N^-}$, respectively.

Figure 9:
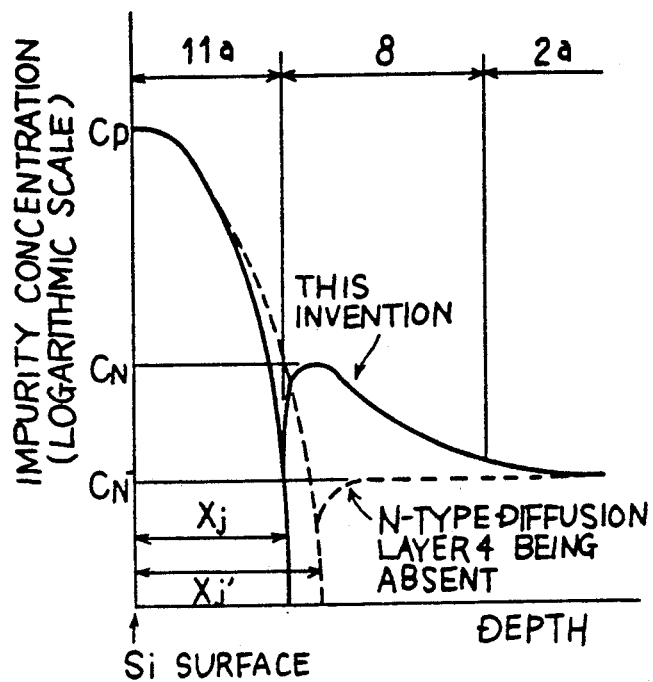
FIG. 9 shows an impurity concentration distribution in the section along A—A of FIG. 6.

FIG. 9 shows a distribution of impurity concentration in the sectional view along the line A—A of FIG. 6. As shown, the presence of the N-type diffusion layer 8 substantially causes a smaller junction depth Xj than the junction depth Xj' in the absence thereof. As a result, the effective channel length is lengthened substantially thereby to reduce the short channel effect. Another effect of the embodiment is that the depletion layer created between the N-type diffusion layer 8 and the P$^+$-type diffusion layer 11a and 11b is prevented from expanding due to a comparatively high concentration of the N-type diffusion layer 8. Furthermore, the punch-through breakdown voltage is improved.

Figure 10:
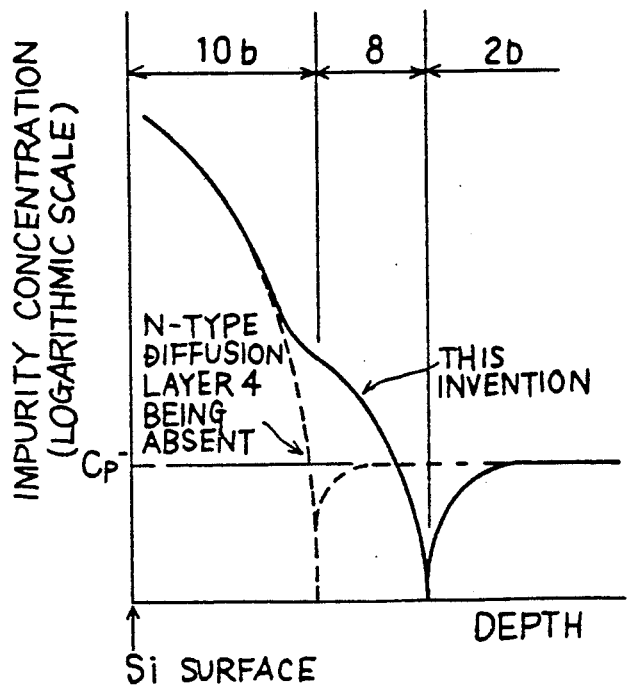
FIG. 10 shows an impurity concentration distribution in the sectional along B—B of FIG. 6.
Figure 11:
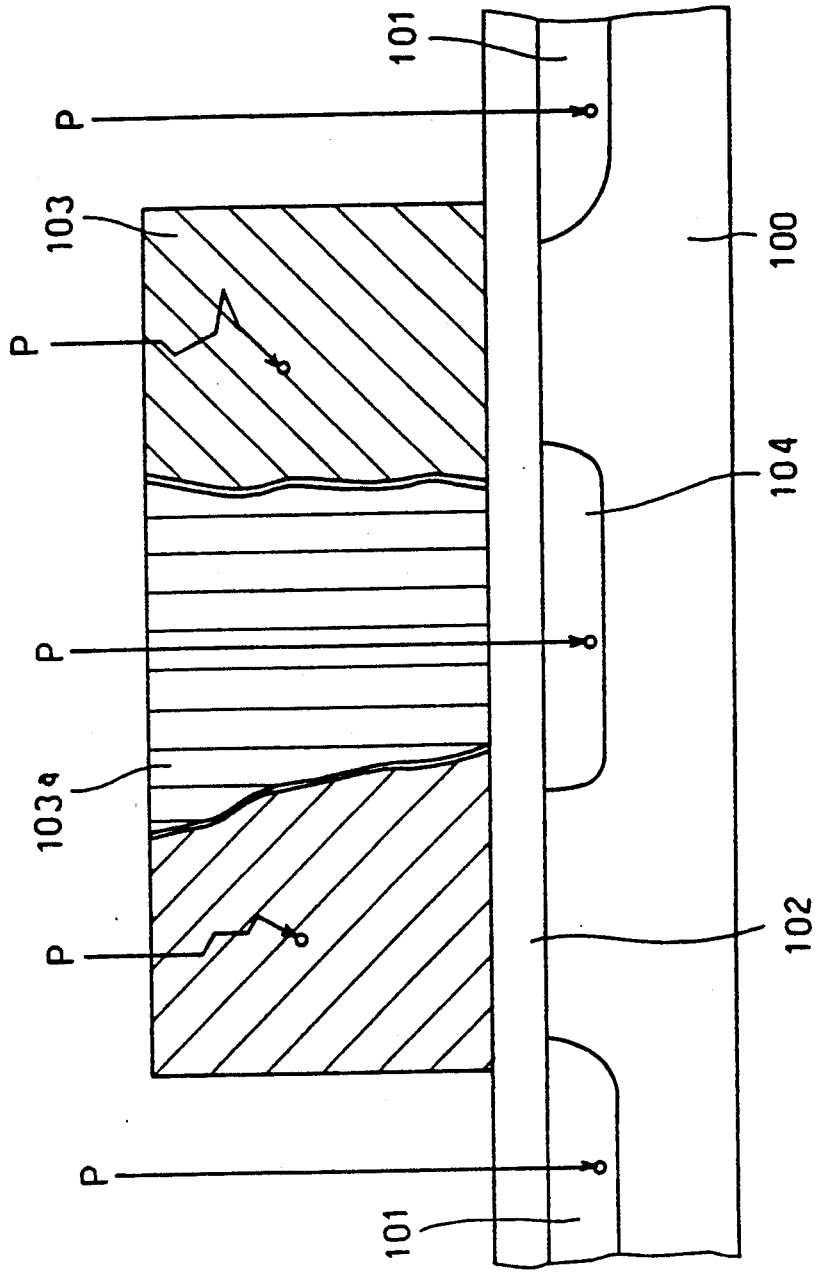
FIG. 11 is a sectional view showing an N type channel transistor formed by a prior method.

Now, referring to the N-MIS(b), the distribution of impurity concentration in the sectional view along line B-B of FIG. 6 is shown in FIG. 10. In the case of N-MIS(b) where the N-type diffusion layer 8 is formed between the N$^+$-type diffusion layer 10a and 10b and the P$^-$-type well region 2b, the distribution of impurity concentration at the drain is gentler than in the absence of the N-type diffusion layer 8. As a consequence, the field concentration at the drain is relaxed, thus reducing the hot carrier effect in the N-MIS(b). The increase in hot carriers which occurs for the P-MIS(a), incidentally, does not pose any problem at all since the hot carriers generated in the P-MIS(a) is fewer by several orders of magnitude than those of the N-MIS(b).

The present invention is not limited to the abovedescribed embodiment, but the other method may be applied.

In the phosphorus ion implant process illustrated in FIG. 3, if the photo-resist is partially and isotrpically etched by means of oxygen ashing so as to obtain a sharp convex trapezoid shape before the phosphorus ion implant, the shadowing effect of ion implant by the side wall of the photo-resist can be reduced even if the phosphorus ion is implanted at an angle of 7 degree from the vertical angle.

Figure 12:
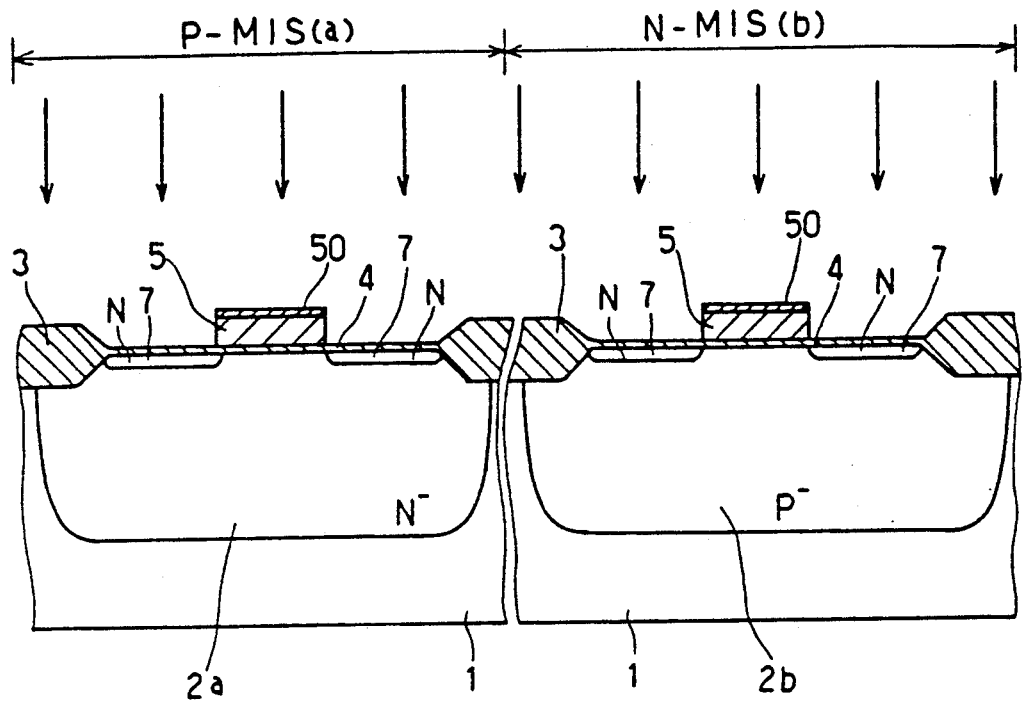
FIG. 12 is a sectional view showing a second method of preventing a channelling phenomenon.

Instead of using the photo-resist 6 as a channelling block layer for preventing the channelling phenomenon in the gate electrode 5, other methods for forming a channelling block layer can be applied. For instance, once the gate electrode 5 is formed as shown in FIG. 2, the photo-resist 6 may be removed. Thereafter, an amorphous silicon oxide film 50 is formed on the gate electrode 5 as shown in FIG. 12 by means of a heat-oxidization method, then the phosphorus ion is implanted. According to this method, as the implanted phosphorus ions are scattered on the amorphous silicon oxide film 50, the phosphorus ion can not go along a grain which is partially formed within the gate electrode 5, even if the crystal axis of such grain is nearly the same as the direction of the phosphorus ion implant. Therefore, the channelling phenomenon can not occur within the gate electrode 5.

Figure 13:
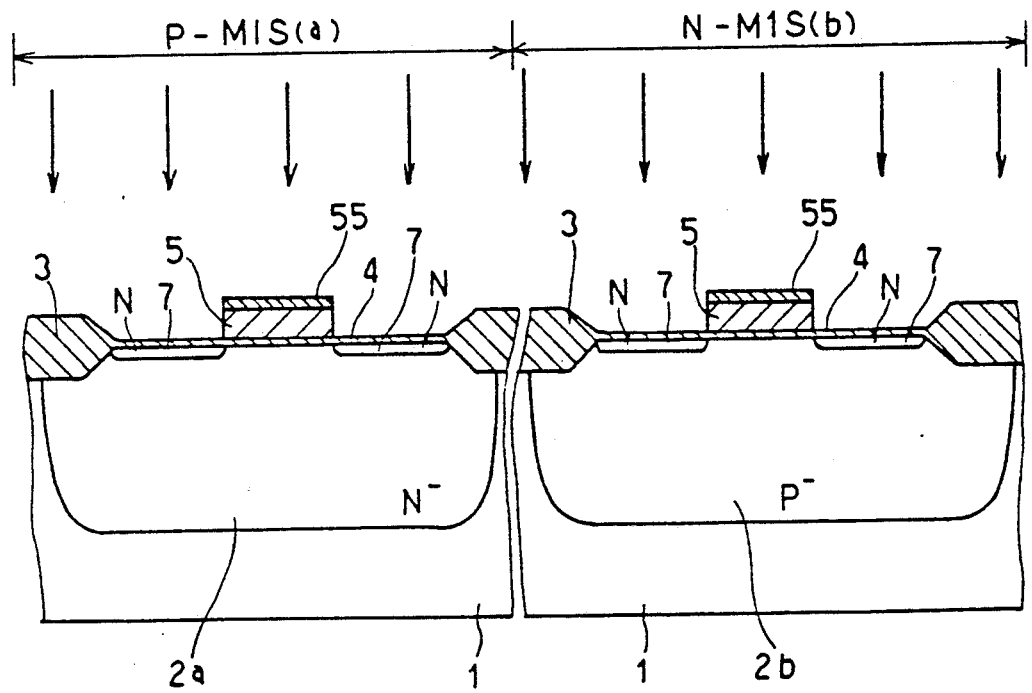
FIG. 13 is a sectional view showing a third method of preventing a channelling phenomenon.

Another alternative method of forming the channelling block layer is to change the upper surface of the gate electrode 5 into an amorphous surface 55 shown in FIG. 13 by means of implanting silicon ions, germanium ions or arsenic ions into the upper surface thereof, before the phosphorus ions implantation for forming the N-type diffusion layer 7. By using such a method, the entire exposed surface of the device as well as the upper surface of gate electrode 5 is changed into an amorphous surface. But such a change is not a problem because such amorphous surface can be changed into a single crystal surface again in a later heat-treatment process. According to this method, the channelling phenomenon can not occur for the same reason as the method explained with reference FIG. 12. In the method shown in FIG. 13, if the arsenic ion is used for making the amorphous surface 55, it is not necessary to dope phosphorus into the gate electrode layer 5a so as to raise the electrical conductivity thereof when the gate electrode layer 5a is formed or thereafter because the arsenic ion raises the electrical conductivity of the gate electrode 5.

What is claimed is:

1. A method of producing a complementary-type semiconductor device comprising the steps of:
    forming a P type well region and an N type well region in a semiconductor substrate;
    forming an insulating film covering the surface of said P type and said N type well regions;
    forming a first gate electrode and a second gate electrode on said insulating film over said P type and said N type well regions respectively, said first gate electrode being provided with a channeling block layer thereon;
    implanting a first N type impurity into areas of said P type and N type well regions which are respectively located around said first and said second gate electrodes so as to form N type diffusion layers in said areas, wherein said channelling block layer is used as a mask for preventing said first N type impurity from channelling into said first gate electrode;
    implanting a second N type impurity into said N type diffusion layer formed in said P type well region so as to form an N+ type diffusion layer therein, the impurity concentration of said N+ type diffusion layer being higher than that of said N type diffusion layers; and
    implanting a P type impurity into the N type diffusion layer formed in said N type well region so as to form a P+ type diffusion layer therein, the impurity concentration of said P+ type diffusion layer being higher than that of said N type diffusion layers.

2. A method according to claim 1, wherein said step for forming said gate electrodes comprises the steps of:
    forming a gate electrode layer on said insulating film;
    forming said channelling block layer on said gate electrode layer in a predetermined pattern; and
    removing said gate electrode layer except where said channelling block layer is formed so as to form said first and said second gate electrodes with said channeling block layer remaining on said gate electrodes.

3. A method according to claim 2, wherein said step for removing said gate electrode layer comprises the step of:
    etching the portions of said gate electrode layer that are not covered by said channelling block layer.

4. A method according to claim 2, wherein said channelling block layer is a photo-resist.

5. A method according to claim 1, wherein said step of forming said gate electrodes includes the step of:
    changing the surface of said first gate electrode into an amorphous surface by means of a heat-oxidization process.

6. A method according to claim 1, wherein said step of forming said gate electrodes includes the step of:
    changing the surface of said first gate electrode into an amorphous surface by means of ion implantation.

7. A method according to claim 1, further comprising the step of:
    forming an oxide film on all exposed surface of said first and said second gate electrodes after said step of implanting said first N type impurity and before said step of implanting said second N type impurity.

8. A method according to claim 1, wherein said first N type impurity implanting step implants phosphorus ions.

9. A method according to claim 1, wherein said second N type impurity implanting step implants arsenic ions.

10. A method of producing a complementary-type semiconductor device comprising the steps of:
    forming a P type well region and an N type well region in a semiconductor substrate;
    forming an insulating film covering the surface of said P type and said N type well regions;
    forming a gate electrode layer on said insulating film;
    forming a photo-resist on said gate electrode layer in a predetermined pattern;
    etching said gate electrode layer except where said photo-resist is formed so as to form a first gate electrode and a second gate electrode over said P type and said N type well regions respectively;
    implanting a first N type impurity into areas of said P type and N type well regions which are respectively located around said first and said second gate electrodes so as to form N type diffusion layers in said areas, by using said photo-resist as a mask for preventing N type impurities from channelling into said first gate electrode;
    implanting a second N type impurity into said N type diffusion layers formed in said P type well region so as to form an N+ type diffusion layer therein, the impurity concentration of said N+ type diffusion layer being higher than that of said N type diffusion layers; and
    implanting a P type impurity into the N type diffusion layers formed in said N type well region so as to form a P+ type diffusion layer therein, the impurity concentration of said P+ type diffusion layer being higher than that of said N type diffusion layers.

11. A method of producing a semiconductor device comprising the steps of:
    forming a P type well region in a semiconductor substrate;
    forming an insulating film covering the surface of said P type well region;
    forming a gate electrode layer on said insulating film;
    forming a photo-resist on said gate electrode layer in a predetermined pattern;
    etching said gate electrode layer except where said photo-resist is formed so as to form a gate electrode;
    implanting a first N type impurity into an area of said P type well region which is located around said gate electrode so as to form an N type diffusion layer therein, wherein said photo-resist is used as a mask for preventing said N type impurity from channelling into said gate electrode; and
    implanting a second N type impurity into said N type diffusion layers formed in said P type well region so as to form an N+ type diffusion layer therein, the impurity concentration of said N+ type diffusion layer being higher than that of said N type diffusion layer.

12. A method of producing a complementary-type semiconductor device comprising the steps of:

forming a P type well region and an N type well region in a semiconductor substrate;

forming an insulating film covering the surface of said P type and said N type well regions;

forming a gate electrode layer on said insulating film;

forming a photo-resist on said gate electrode layer in a predetermined pattern;

etching said gate electrode layer except where said photo-resist is formed so as to form first and second gate electrodes over said P type and said N type well regions; and implanting a N type impurity into areas of said P type and N type well regions which are respectively located around said first and said second gate electrodes so as to form N type diffusion layers in said areas, wherein said photo-resist is used as a mask for preventing said first N type impurity from channelling in said first gate electrode.

* * * * *